United States Patent
Chen et al.

(10) Patent No.: US 10,497,607 B2
(45) Date of Patent: Dec. 3, 2019

(54) MANUFACTURING METHOD OF INTERCONNECT STRUCTURE

(71) Applicant: United Microelectronics Corp., Hsinchu (TW)

(72) Inventors: Li-Han Chen, Tainan (TW); Chun-Chieh Chiu, Keelung (TW); Wei-Chuan Tsai, Changhua County (TW); Yen-Tsai Yi, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 1 day.

(21) Appl. No.: 15/711,854

(22) Filed: Sep. 21, 2017

(65) Prior Publication Data
US 2019/0057895 A1   Feb. 21, 2019

(30) Foreign Application Priority Data
Aug. 16, 2017  (TW) .............. 106127797 A

(51) Int. Cl.
*H01L 21/74* (2006.01)
*H01L 21/768* (2006.01)

(52) U.S. Cl.
CPC ...... *H01L 21/743* (2013.01); *H01L 21/76804* (2013.01); *H01L 21/76843* (2013.01); *H01L 21/76864* (2013.01)

(58) Field of Classification Search
CPC ........... H01L 29/7848; H01L 21/28097; H01L 21/76889; H01L 21/76843; H01L 21/76864
See application file for complete search history.

(56) References Cited

U.S. PATENT DOCUMENTS

| | | | |
|---|---|---|---|
| 5,654,233 A | 8/1997 | Yu | |
| 6,982,226 B1 | 1/2006 | Merchant et al. | |
| 7,649,232 B2 | 1/2010 | Tamura et al. | |
| 9,312,356 B1* | 4/2016 | Lin | H01L 29/4966 |
| 9,355,903 B2* | 5/2016 | Lee | H01L 23/5329 |
| 9,899,258 B1* | 2/2018 | Wu | H01L 21/76847 |
| 2005/0093158 A1* | 5/2005 | Liu | H01L 21/4846 257/758 |
| 2007/0161233 A1* | 7/2007 | Seok | H01L 21/02063 438/638 |
| 2008/0164531 A1* | 7/2008 | Jawarani | H01L 21/76829 257/369 |
| 2009/0026618 A1* | 1/2009 | Kim | H01L 21/76843 257/751 |
| 2009/0166866 A1* | 7/2009 | Fastow | H01L 21/28518 257/751 |
| 2011/0084320 A1* | 4/2011 | Jung | H01L 21/28512 257/288 |

(Continued)

*Primary Examiner* — Latanya N Crawford
(74) *Attorney, Agent, or Firm* — J.C. Patents

(57) ABSTRACT

A manufacturing method of an interconnect structure including the following steps is provided. A dielectric layer is formed on a silicon layer, wherein an opening exposing the silicon layer is in the dielectric layer. A metal layer is formed on the surface of the opening. A stress adjustment layer is formed on the metal layer. A thermal process is performed to react the metal layer with the silicon layer to form a metal silicide layer on the silicon layer. The stress adjustment layer is removed after the thermal process is performed. A barrier layer is formed on the surface of the opening.

20 Claims, 4 Drawing Sheets

(56) References Cited

U.S. PATENT DOCUMENTS

| | | | |
|---|---|---|---|
| 2012/0161324 A1* | 6/2012 | Heinrich | H01L 21/28518 257/757 |
| 2014/0206190 A1* | 7/2014 | Li | H01L 29/401 438/683 |
| 2014/0256103 A1* | 9/2014 | Kim | H01L 21/283 438/270 |
| 2015/0014759 A1* | 1/2015 | Lee | H01L 23/5329 257/306 |
| 2016/0244874 A1* | 8/2016 | Ge | C23C 14/345 |
| 2017/0352738 A1* | 12/2017 | Balakrishnan | H01L 29/4941 |

* cited by examiner

MANUFACTURING METHOD OF INTERCONNECT STRUCTURE

CROSS-REFERENCE TO RELATED APPLICATION

This application claims the priority benefit of Taiwan application serial no. 106127797, filed on Aug. 16, 2017. The entirety of the above-mentioned patent application is hereby incorporated by reference herein and made a part of this specification.

BACKGROUND OF THE INVENTION

Field of the Invention

The invention relates to a manufacturing method of a semiconductor structure, and more particularly, to a manufacturing method of an interconnect structure.

Description of Related Art

As the integration of the semiconductor device increases, the pattern and linewidth of the semiconductor device are gradually reduced, and therefore contact resistance between electrodes and interconnects in the semiconductor device is increased. As a result, greater resistance-capacitance delay (RC delay) occurs and the operating speed of the semiconductor device is affected.

Since the resistance of the metal silicide is lower, contact resistance between electrodes and interconnects in the semiconductor device can be reduced by the metal silicide.

However, how to further reduce the contact resistance of the metal silicide is a current object of ongoing efforts in the industry.

SUMMARY OF THE INVENTION

The invention provides a manufacturing method of an interconnect structure that allows a metal silicide layer to have lower contact resistance and higher on-current ($I_{on}$).

The invention provides a manufacturing method of an interconnect structure including the following steps. A dielectric layer is formed on a silicon layer, wherein an opening exposing the silicon layer is in the dielectric layer. A metal layer is formed on the surface of the opening. A stress adjustment layer is formed on the metal layer. A thermal process is performed to react the metal layer with the silicon layer to form a metal silicide layer on the silicon layer. The stress adjustment layer is removed after the thermal process is performed. A barrier layer is formed on the surface of the opening.

According to an embodiment of the invention, in the manufacturing method of the interconnect structure, the stress adjustment layer and the barrier layer are, for instance, formed by using different deposition methods.

According to an embodiment of the invention, in the manufacturing method of the interconnect structure, the silicon layer is, for instance, a silicon substrate or an epitaxial silicon layer.

According to an embodiment of the invention, in the manufacturing method of the interconnect structure, the forming method of the dielectric layer is, for instance, a chemical vapor deposition (CVD) method.

According to an embodiment of the invention, in the manufacturing method of the interconnect structure, the material of the metal layer is, for instance, titanium (Ti), nickel (Ni), or cobalt (Co).

According to an embodiment of the invention, in the manufacturing method of the interconnect structure, the forming method of the metal layer is, for instance, a physical vapor deposition (PVD) method or a CVD method.

According to an embodiment of the invention, in the manufacturing method of the interconnect structure, the material of the stress adjustment layer is, for instance, titanium nitride (TiN), silicon nitride (SiN), or a combination thereof.

According to an embodiment of the invention, in the manufacturing method of the interconnect structure, the forming method of the stress adjustment layer is, for instance, a radio frequency physical vapor deposition (RF-PVD) method.

According to an embodiment of the invention, in the manufacturing method of the interconnect structure, the stress of the stress adjustment layer can be adjusted by configuring the variable capacitance of a deposition machine.

According to an embodiment of the invention, in the manufacturing method of the interconnect structure, the stress adjustment layer can further completely fill the opening.

According to an embodiment of the invention, in the manufacturing method of the interconnect structure, the thermal process is, for instance, an annealing process.

According to an embodiment of the invention, in the manufacturing method of the interconnect structure, the material of the metal silicide layer is, for instance, titanium silicide (TiSi), nickel silicide (NiSi), or cobalt silicide (CoSi).

According to an embodiment of the invention, in the manufacturing method of the interconnect structure, the metal layer not reacted with the silicon layer can be further removed at the same time of removing the stress adjustment layer.

According to an embodiment of the invention, in the manufacturing method of the interconnect structure, the removal method of the stress adjustment layer is, for instance, a wet etching method.

According to an embodiment of the invention, in the manufacturing method of the interconnect structure, the etchant of the wet etching method is, for instance, diluted hydrofluoric acid (DHF) or a sulfuric peroxide mixture (SPM).

According to an embodiment of the invention, in the manufacturing method of the interconnect structure, the material of the barrier layer is, for instance, titanium nitride (TiN).

According to an embodiment of the invention, in the manufacturing method of the interconnect structure, the forming method of the barrier layer is, for instance, a CVD method or an atomic layer deposition (ALD) method.

According to an embodiment of the invention, in the manufacturing method of the interconnect structure, a conductive layer completely filling the opening can be further formed on the barrier layer.

According to an embodiment of the invention, in the manufacturing method of the interconnect structure, the material of the conductive layer is, for instance, tungsten (W).

According to an embodiment of the invention, in the manufacturing method of the interconnect structure, the forming method of the conductive layer is, for instance, a PVD method.

Based on the above, in the manufacturing method of the interconnect structure provided in the invention, since the stress adjustment layer is formed on the metal layer and the stress adjustment layer is removed after a thermal process is performed, the stress of the substrate can be adjusted by the stress of the stress adjustment layer to increase the thickness of the resulting metal silicide layer. As a result, the metal silicide layer can have lower contact resistance and higher on-current.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
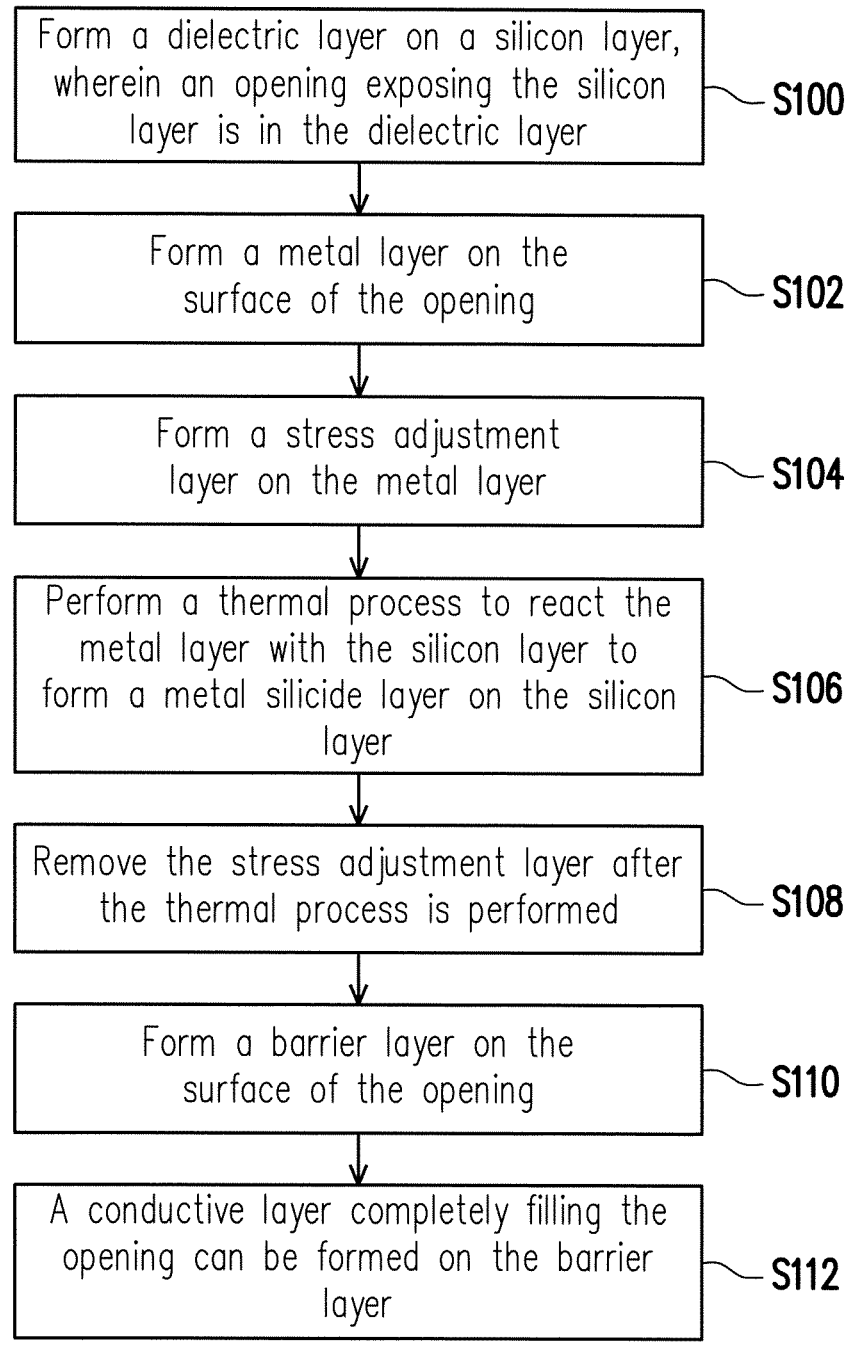
FIG. 1 is a manufacturing process of an interconnect structure of an embodiment of the invention.

FIG. 1 is a manufacturing process of an interconnect structure of an embodiment of the invention. FIG. 2A to FIG. 2F are cross sections of the manufacturing process of the interconnect structure of an embodiment of the invention.

Figure 2A:
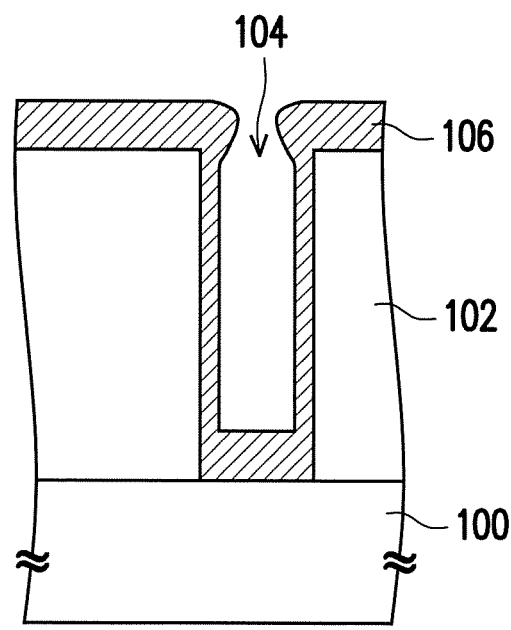
FIG. 2A to FIG. 2F are cross sections of the manufacturing process of the interconnect structure of an embodiment of the invention.

Referring to FIG. 1 and FIG. 2A, step S100 is performed to form a dielectric layer 102 on a silicon layer 100, wherein an opening 104 exposing the silicon layer 100 is in the dielectric layer 102. The silicon layer 100 is, for instance, a silicon substrate or an epitaxial silicon layer. In the present embodiment, the silicon layer 100 is exemplified by a silicon substrate, but the invention is not limited thereto. In other embodiments, the silicon layer 100 can also be other silicon-containing films such as an epitaxial silicon layer. However, any material of the silicon layer 100 that can react with the metal layer 106 subsequently formed on the silicon layer 100 to form the metal silicide layer 110 (FIG. 2C) is within the scope of the invention.

The material of the dielectric layer 102 is, for instance, silicon oxide. The forming method of the dielectric layer 102 is, for instance, a chemical vapor deposition (CVD) method. The forming method of the opening 104 includes, for instance, patterning the dielectric layer 102.

Step S102 is performed to form a metal layer 106 on the surface of the opening 104. The material of the metal layer 106 is, for instance, titanium, nickel, or cobalt. In the present embodiment, the material of the metal layer 106 is exemplified by titanium, but the invention is not limited thereto. However, any material of the metal layer 106 that can react with the silicon layer 100 to form the metal silicide layer 110 (FIG. 2C) is within the scope of the invention. The forming method of the metal layer 106 is, for instance, a physical vapor deposition (PVD) method or a CVD method.

Figure 2B:
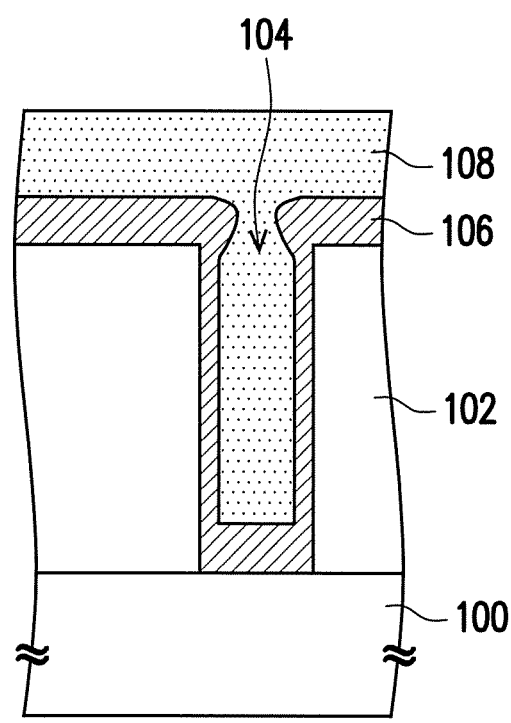

Referring to FIG. 1 and FIG. 2B, step S104 is performed to form a stress adjustment layer 108 on the metal layer 106. Moreover, the stress adjustment layer 108 can further completely fill the opening 104. The material of the stress adjustment layer 108 is, for instance, titanium nitride, silicon nitride, or a combination thereof. In the present embodiment, the material of the stress adjustment layer 108 is exemplified by titanium nitride, but the invention is not limited thereto. The forming method of the stress adjustment layer 108 is, for instance, a radio frequency physical vapor deposition (RF-PVD) method.

Moreover, the stress of the substrate 100 can be adjusted by the stress of the stress adjustment layer 108 such that the thickness of the subsequently formed metal silicide layer 110 (FIG. 2C) is increased to reduce contact resistance. The stress of the stress adjustment layer 108 can be adjusted by configuring the variable capacitance of a deposition machine.

Moreover, the stress adjustment layer 108 can prevent degraded adhesion caused by the oxidation of the metal layer 106 to prevent peeling of the subsequently formed barrier layer 112 (FIG. 2E) or conductive layer 114 (FIG. 2F) in a process such as chemical mechanical polishing and extend the process queue time (Q-time) to reduce defects.

Figure 2C:
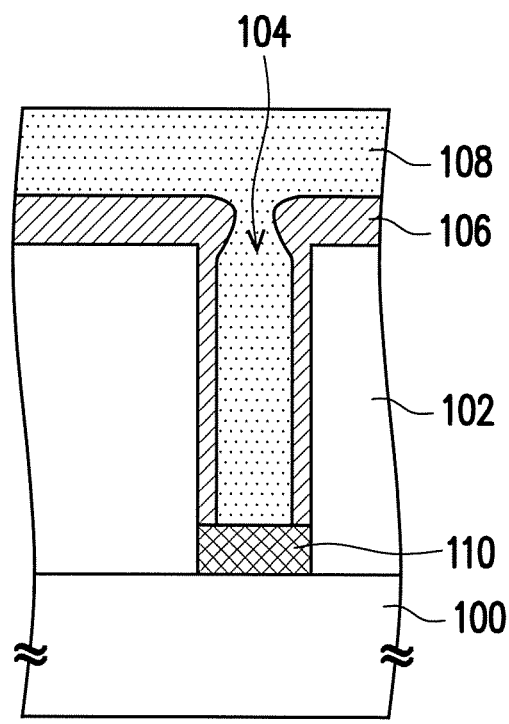

Referring to FIG. 1 and FIG. 2C, step S106 is performed to perform a thermal process to react the metal layer 106 with the silicon layer 100 to form a metal silicide layer 110 on the silicon layer 100. The thermal process is, for instance, an annealing process. The metal silicide layer 110 can be formed using a self-aligned metal silicide process. The material of the metal silicide layer 110 is, for instance, titanium silicide, nickel silicide, or cobalt silicide. In the present embodiment, the material of the metal silicide layer 110 is exemplified by titanium silicide, but the invention is not limited thereto.

For instance, when the material of the metal layer 106 is titanium and reacts with the silicon layer 100, a metal silicide layer 110 for which the material is titanium silicide can be formed. At this point, when the material of the stress adjustment layer 108 is titanium nitride, the stress of the stress adjustment layer 108 can be adjusted to a stress suitable for forming the metal silicide layer 110 having a greater thickness. For instance, the stress adjustment layer 108 can be adjusted to have a greater compressive stress.

Figure 2D:
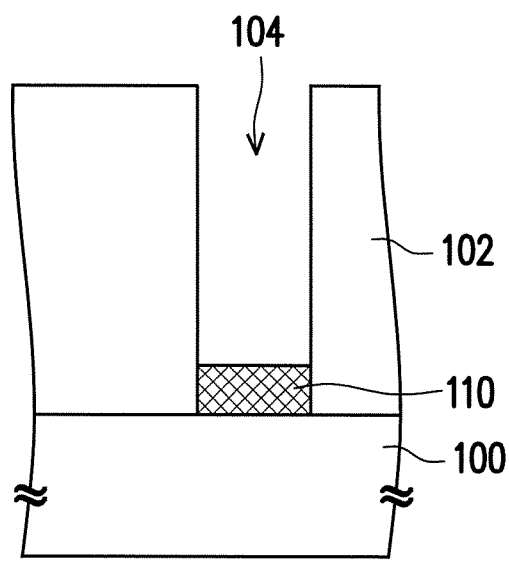

Referring to FIG. 1 and FIG. 2D, step S108 is performed to remove the stress adjustment layer 108 after the thermal process is performed. The removal process of the stress adjustment layer 108 is, for instance, a wet etching method. The etchant of the wet etching method is, for instance, diluted hydrofluoric acid (DHF) or a sulfuric peroxide mixture (SPM).

Moreover, when the stress adjustment layer 108 is removed, the metal layer 106 not reacted with the silicon layer 100 can be removed at the same time. By removing the metal layer 106 not reacted with the silicon layer 100, degraded adhesion caused by oxidation of the metal layer 106 can be prevented.

Moreover, since the metal layer 106 can be removed in this step, the metal layer 106 can be made to have a greater thickness to facilitate the forming of the metal silicide layer 110 having a greater thickness. In another embodiment, in the case that the metal layer 106 has a greater thickness, the metal layer 106 may seal the opening 104.

Figure 2E:
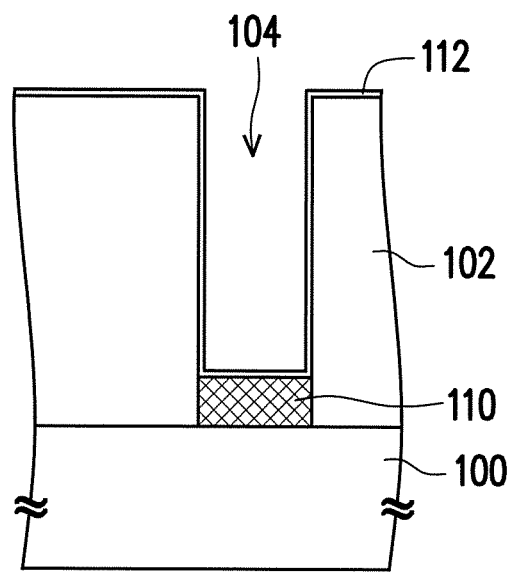

Referring to FIG. 1 and FIG. 2E, step S110 is performed to form a barrier layer 112 on the surface of the opening 104. The material of the barrier layer 112 is, for instance, titanium nitride. In the present embodiment, in the case that the materials of the stress adjustment layer 108 and the barrier layer 112 are both titanium nitride, the compressive stress of the stress adjustment layer 108 is, for instance, greater than the compressive stress of the barrier layer 112. The stress adjustment layer 108 and the barrier layer 112 are, for instance, formed by using different deposition methods. For instance, the forming method of the stress adjustment layer 108 is, for instance, an RF PVD method, and the forming method of the barrier layer 112 is, for instance, a CVD method or an atomic layer deposition (ALD) method.

Generally, after the barrier layer 112 for which the material is titanium nitride is formed, a $N_2$ treatment may be performed on the barrier layer 112 to remove impurities. In the present embodiment, since the metal silicide layer 110 is formed before the $N_2$ treatment is performed on the barrier layer 112, the forming of the metal silicide layer 110 is not affected by the $N_2$ treatment, and the metal silicide layer 110 can have a greater thickness.

Figure 2F:
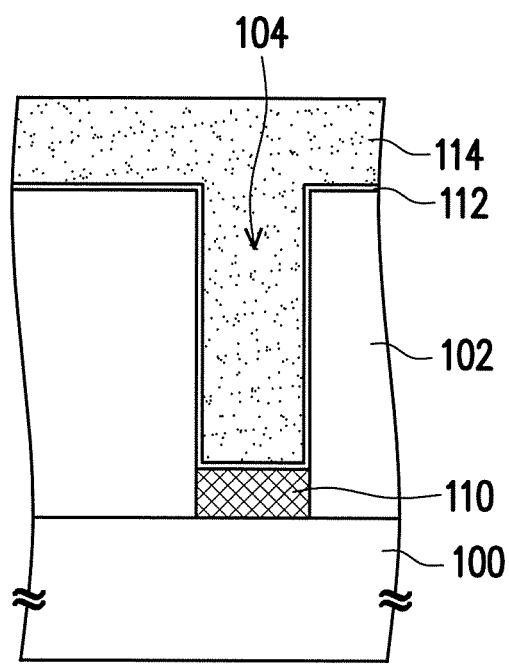

Referring to FIG. 1 and FIG. 2F, step S112 can be performed to form a conductive layer 114 completely filling the opening 104 on the barrier layer 112. The material of the conductive layer 114 is, for instance, tungsten. The forming method of the conductive layer 114 is, for instance, a PVD method.

In the present embodiment, since the metal layer 106 can be removed, when the conductive layer 114 is formed in the opening 104, the metal layer 106 is absent in the opening 104, and overhang of the metal layer 106 does not occur at the top portion of the opening 104. As a result, the gap fill window of filling the conductive layer 114 in the opening 104 can be effectively increased.

Based on the above, in the manufacturing method of the interconnect structure, since a stress adjustment layer 108 is formed on the metal layer 106 and the stress adjustment layer 108 is removed after the thermal process is performed, the stress of the substrate 100 can be adjusted by the stress of the stress adjustment layer 108 to increase the thickness of the resulting metal silicide layer 110. As a result, the metal silicide layer 110 can have lower contact resistance and higher on-current.

Based on the above, in the manufacturing method of the interconnect structure provided in the embodiments, the resulting metal silicide layer can have lower contact resistance and higher on-current via the process of a stress adjustment layer.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of an interconnect structure, comprising:
    forming a dielectric layer on a silicon layer, wherein an opening exposing the silicon layer is in the dielectric layer;
    forming a metal layer on a surface of the opening, wherein the metal layer is in direct contact with the silicon layer;
    forming a stress adjustment layer on the metal layer;
    performing a thermal process to react the metal layer with the silicon layer to form a metal silicide layer on the silicon layer;
    removing the stress adjustment layer after the thermal process is performed; and
    forming a barrier layer on the surface of the opening, wherein a compressive stress of the stress adjustment layer is greater than a compressive stress of the barrier layer.

2. The manufacturing method of the interconnect structure of claim 1, wherein the stress adjustment layer and the barrier layer are formed by using different deposition methods.

3. The manufacturing method of the interconnect structure of claim 1, wherein the silicon layer comprises a silicon substrate or an epitaxial silicon layer.

4. The manufacturing method of the interconnect structure of claim 1, wherein a forming method of the dielectric layer comprises a chemical vapor deposition method.

5. The manufacturing method of the interconnect structure of claim 1, wherein a material of the metal layer comprises titanium, nickel, or cobalt.

6. The manufacturing method of the interconnect structure of claim 1, wherein a forming method of the metal layer comprises a physical vapor deposition (PVD) method or a chemical vapor deposition (CVD) method.

7. The manufacturing method of the interconnect structure of claim 1, wherein a material of the stress adjustment layer comprises titanium nitride, silicon nitride, or a combination thereof.

8. The manufacturing method of the interconnect structure of claim 1, wherein a forming method of the stress adjustment layer comprises a radio frequency physical vapor deposition (RF-PVD) method.

9. The manufacturing method of the interconnect structure of claim 1, wherein a stress of the stress adjustment layer is adjusted by configuring a variable capacitance of a deposition machine.

10. The manufacturing method of the interconnect structure of claim 1, wherein the stress adjustment layer further completely fills the opening.

11. The manufacturing method of the interconnect structure of claim 1, wherein the thermal process comprises an annealing process.

12. The manufacturing method of the interconnect structure of claim 1, wherein a material of the metal silicide layer comprises titanium silicide, nickel silicide, or cobalt silicide.

13. The manufacturing method of the interconnect structure of claim 1, further comprising removing the metal layer not reacted with the silicon layer at the same time of removing the stress adjustment layer.

14. The manufacturing method of the interconnect structure of claim 1, wherein a removal method of the stress adjustment layer comprises a wet etching method.

15. The manufacturing method of the interconnect structure of claim 14, wherein an etchant of the wet etching method comprises diluted hydrofluoric acid or a sulfuric peroxide mixture.

16. The manufacturing method of the interconnect structure of claim 1, wherein a material of the barrier layer comprises titanium nitride.

17. The manufacturing method of the interconnect structure of claim 1, wherein a forming method of the barrier layer comprises a CVD method or an atomic layer deposition (ALD) method.

18. The manufacturing method of the interconnect structure of claim 1, further comprising forming a conductive layer completely filling the opening on the barrier layer.

19. The manufacturing method of the interconnect structure of claim 18, wherein a material of the conductive layer comprises tungsten.

20. The manufacturing method of the interconnect structure of claim 18, wherein a forming method of the conductive layer comprises a PVD method.

* * * * *